United States Patent
Brown et al.

(10) Patent No.: US 8,110,887 B2
(45) Date of Patent: Feb. 7, 2012

(54) PHOTODETECTOR AND DISPLAY DEVICE PROVIDED WITH THE SAME

(75) Inventors: Christopher Brown, Oxford (GB); Hiromi Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 143 days.

(21) Appl. No.: 12/602,395

(22) PCT Filed: Jun. 12, 2008

(86) PCT No.: PCT/JP2008/060773
§ 371 (c)(1),
(2), (4) Date: Nov. 30, 2009

(87) PCT Pub. No.: WO2008/156024
PCT Pub. Date: Dec. 24, 2008

(65) Prior Publication Data
US 2010/0171128 A1    Jul. 8, 2010

(30) Foreign Application Priority Data

Jun. 21, 2007 (JP) ................. 2007-164284

(51) Int. Cl.
*H01L 31/102* (2006.01)
(52) U.S. Cl. ........ 257/458; 257/290; 257/431; 257/656; 257/E31.041; 257/E31.061
(58) Field of Classification Search ................. 257/290, 257/292, 293, 431, 458, 656, E31.041, E31.061; 348/294
See application file for complete search history.

(56) References Cited

U.S. PATENT DOCUMENTS

| | | | |
|---|---|---|---|
| 6,236,063 B1 | 5/2001 | Yamazaki et al. | |
| 6,489,631 B2* | 12/2002 | Young et al. | 257/59 |
| 7,205,641 B2* | 4/2007 | Shiu et al. | 257/656 |
| 7,829,920 B2* | 11/2010 | Cho et al. | 257/292 |

(Continued)

FOREIGN PATENT DOCUMENTS

| | | |
|---|---|---|
| JP | 2003-273361 | 9/2003 |
| JP | 2004-54281 | 2/2004 |
| JP | 2007-114315 | 5/2007 |

OTHER PUBLICATIONS

U.S. Appl. No. 12/601,990, filed Nov. 25, 2009, entitled "Photodetector and Display Device Provided with the Same". International Search Report for PCT/JP2008/060773, mailed Sep. 2, 2008.

*Primary Examiner* — Evan Pert
*Assistant Examiner* — Eduardo A Rodela
(74) *Attorney, Agent, or Firm* — Nixon & Vanderhye P.C.

(57) ABSTRACT

Provided are a photodetector capable of suppressing variations in the output characteristics among photodiodes, and a display device provided with the photodetector. A display device in use has an active matrix substrate (20) including a transparency base substrate (2), a plurality of active elements and a photodetector. The photodetector includes a light-shielding layer (3) provided on the base substrate (2), and a photodiode (1) arranged on an upper layer of the light-shielding layer (3). The light-shielding layer (3) is overlapped with the photodiode (1) in the thickness direction of the base substrate (2). The photodiode (1) includes a silicon layer (11) insulated electrically from the light-shielding layer (3). The silicon layer (11) includes a p-layer (11c), an i-layer (11b) and an n-layer (11a) that are provided adjacent to each other in the planar direction. The p-layer (11c) is formed so that its area (length $L_p$) will be larger than the area (length $L_n$) of the n-layer (11a).

6 Claims, 12 Drawing Sheets

U.S. PATENT DOCUMENTS

| | | |
|---|---|---|
| 7,952,159 B2 * | 5/2011 | Weng et al. .................... 257/458 |
| 7,955,890 B2 * | 6/2011 | Choi et al. ...................... 438/93 |
| 2005/0045881 A1 | 3/2005 | Nakamura et al. |
| 2007/0069632 A1 | 3/2007 | Peng |
| 2007/0093007 A1 * | 4/2007 | Deane ........................... 438/154 |
| 2009/0008665 A1 * | 1/2009 | Lee et al. ........................ 257/98 |
| 2009/0050891 A1 | 2/2009 | Katoh |

* cited by examiner

PHOTODETECTOR AND DISPLAY DEVICE PROVIDED WITH THE SAME

This application is the U.S. national phase of International Application No. PCT/JP2008/060773, filed 12 Jun. 2008, which designated the U.S. and claims priority to Japanese Application No. 2007-164284, filed 21 Jun. 2007, the entire contents of each of which are hereby incorporated by reference.

TECHNICAL FIELD

The technology presented herein relates to a photodetector and a display device provided with the same.

BACKGROUND

Recently, a display device represented by a liquid crystal display device often is equipped with a photo sensor for automatically adjusting brightness of a display screen in accordance with the intensity of light surrounding the display device. A display device having a plurality of photo sensors arranged in a matrix also has been known. In this display device, the plural photo sensors function as one area sensor, thereby capturing an image at the observer side.

The incorporation of the photo sensor in the display device can be achieved by mounting a photo sensor as a discrete component on a display panel thereof. Alternatively, a photo sensor can be formed monolithically on an active matrix substrate by utilizing a process for forming an active element (TFT) or a peripheral circuit.

In the field of a display device for a mobile terminal device in particular, the photo sensor is required to be formed monolithically on the active matrix substrate, from the viewpoint of reducing the number of components and downsizing the display device. As the photo sensor formed monolithically, a photodiode formed of a silicon layer, for instance, is known (see, for instance, JP 2006-3857 A: FIGS. 2 and 3).

Hereinafter, a conventional photodiode (photo sensor) will be explained with reference to FIG. 12. FIG. 12 is a cross-sectional view showing a configuration of a liquid crystal display panel having a photodiode. As shown in FIG. 12, a photodiode 51 is a PIN diode having a lateral structure, which is formed monolithically on an active matrix substrate 50 that forms a liquid crystal display panel.

As shown in FIG. 12, the photodiode 51 includes a silicon layer 60. The silicon layer 60 is formed on a glass substrate 52 as the base substrate of the active matrix substrate 50, by utilizing a process of forming a thin film transistor (TFT) that functions as an active element, at the same time of forming the TFT. Further on the silicon layer 60, an n-type semiconductor region (n-layer) 51a, an intrinsic semiconductor region (i-layer) 51b and a p-type semiconductor region (p-layer) 51c are formed in this order along the planar direction. The i-layer 51b serves as a photodetection region of the photodiode 51.

On an under layer of the photodiode 51, a light-shielding layer 53 for shielding light from a backlight device (not shown) is provided. The light-shielding layer 53 is covered with an insulating base coat 54. Typically the light-shielding layer 53 is formed of a metal material. The light-shielding layer 53 is in an electrically suspended state, insulated from the ambience. The photodiode 51 is covered further with interlayer insulating layers 55 and 56.

In FIG. 12, numeral 57 denotes a wiring connected to the n-layer 51a, and 58 denotes a wiring connected to the p-layer 51c. Numeral 59 denotes a flattening layer, and 61 denotes a protective layer. Numeral 62 denotes a liquid crystal layer. For a filter substrate 63, only the appearance is shown.

In the example as shown in FIG. 12, since the metal light-shielding layer 53 is arranged on the under layer of the photodiode 51, the output characteristics of the photodiode 51 fluctuate with the fluctuation in an electric potential of the light-shielding layer 53. And the electric potential of the light-shielding layer 53 fluctuates in connection with the fluctuation in an electric potential of the photodiode p-layer 51c.

However, the light-shielding layer 53, the photodiode 51 and the other films positioned in the vicinity of the photodiode 51 contain a fixed charge captured during the formation process. The amount of the fixed charge varies among the photodiodes or the active matrix substrates, and the difference in the fixed charge results in the difference in the relationship between the electric potential of the light-shielding layer 53 and the output characteristics of the photodiode. Namely, in a case where a plurality of photodiodes 51 of the same specification are provided, the output characteristics may vary among the photodiodes even though an equal voltage is applied to the respective p-layers 51c and the electric potentials in the respective light-shielding layers are set to be equivalent.

The relationship between the electric potential of the light-shielding layer 53 and the output characteristics of the photodiode will vary due to not only the fixed charge but the variations in the diffusion concentration of impurities in the semiconductor regions of the photodiode 51. Similarly to the above-described case, the output characteristics may be varied among the photodiodes even though an equivalent voltage is applied to the respective p-layers 51c.

As mentioned above, in the example as shown in FIG. 12, a problem that the output characteristics vary among the photodiodes arises. Specifically for instance, the output characteristics are different from one product to another even for the photodiodes of the same specification. Alternatively, the output characteristics are different from one photodiode to another even for photodiodes of the same specification mounted on the same active matrix substrate. In such a case, it will be difficult to adjust the brightness of the display screen with the photo sensor or to capture a high-resolution picture.

SUMMARY

An feature of an example embodiment presented herein is to provide a photodetector capable of solve the above-mentioned problems and suppressing variations in the output characteristics among the photodiodes, and a display device provided with the photodetector.

For achieving the above-described feature, a photodetector according to the present embodiment is characterized in that it includes a transparency base substrate, a metal layer provided on one main surface of the base substrate, and a photodiode arranged on an upper layer of the metal layer, wherein the metal layer is formed to be overlapped with the entire photodiode in the thickness direction of the base substrate, the photodiode comprises a silicon layer insulated electrically from the metal layer, the silicon layer has a p-type semiconductor region, an intrinsic semiconductor region and an n-type semiconductor region that are formed adjacent to each other in the planar direction of the silicon layer, and the p-type semiconductor region is formed to have an area larger than the area of the n-type semiconductor region.

And, for achieving the above-described feature, a display device according to the present embodiment is a display device characterized in that it has an active matrix substrate, wherein the active matrix substrate comprises a transparency base substrate, a plurality of active elements formed on one main surface of the base substrate, and a photodetector, the photodetector comprises a metal layer provided on one main surface of the base substrate, and a photodiode arranged on an upper layer of the metal layer, the metal layer is formed to be overlapped with the entire photodiode in the thickness direction of the base substrate, the photodiode comprises a silicon layer insulated electrically from the metal layer, the silicon layer has a p-type semiconductor region, an intrinsic semiconductor region and an n-type semiconductor region that are formed adjacent to each other in the planar direction of the silicon layer, and the p-type semiconductor region is formed to have an area larger than the area of the n-type semiconductor region.

As mentioned above, according to the present embodiment, fluctuation in the output characteristics of photodiodes can be adjusted, and thus, when an equal voltage is applied to photodiodes of the same specification, it is possible to control so as to equalize the output characteristics. Thus, according to the present embodiment, it is possible to suppress a fluctuation in the output characteristics among the photodiodes, and to suppress variations in the output characteristics among the photodiodes.

BRIEF DESCRIPTION OF DRAWINGS

FIG. 4 includes diagrams showing an electric potential of a light-shielding layer and a state of a photodiode.

FIG. 5 includes diagrams showing an electric potential of a light-shielding layer and a state of a photodiode. FIG. 5 is distinguished from FIG. 4 in the electric potential level of the light-shielding layer.

FIG. 6 includes diagrams showing an electric potential of a light-shielding layer and a state of a photodiode. FIG. 6 is distinguished from FIGS. 4 and 5 in the electric potential level of the light-shielding layer.

FIG. 9 shows an example distinguished from FIG. 8 in the relationship between the electric potential of the light-shielding layer and the output characteristics of the photodiode.

FIG. 10 shows an example distinguished from FIGS. 8 and 9 in the relationship between the electric potential of the light-shielding layer and the output characteristics of the photodiode.

DETAILED DESCRIPTION

A photodetector according to the present embodiment is characterized in that a transparency base substrate, a metal layer provided on one main surface of the base substrate, and a photodiode arranged on an upper layer of the metal layer, wherein the metal layer is formed to be overlapped with the entire photodiode in the thickness direction of the base substrate, the photodiode comprises a silicon layer insulated electrically from the metal layer, the silicon layer has a p-type semiconductor region, an intrinsic semiconductor region and an n-type semiconductor region that are formed adjacent to each other in the planar direction of the silicon layer, and the p-type semiconductor region is formed to have an area larger than the area of the n-type semiconductor region.

A display device according to the present embodiment is characterized in that it has an active matrix substrate, wherein the active matrix substrate comprises a transparency base substrate, a plurality of active elements formed on one main surface of the base substrate, and a photodetector, the photodetector comprises a metal layer provided on one main surface of the base substrate, and a photodiode arranged on an upper layer of the metal layer, the metal layer is formed to be overlapped with the entire photodiode in the thickness direction of the base substrate, the photodiode comprises a silicon layer insulated electrically from the metal layer, the silicon layer has a p-type semiconductor region, an intrinsic semiconductor region and an n-type semiconductor region that are formed adjacent to each other in the planar direction of the silicon layer, and the p-type semiconductor region is formed to have an area larger than the area of the n-type semiconductor region.

In the photodetector and the display device according to the present embodiment, the length of the p-type semiconductor region in the forward direction can be set to be greater than the length of the n-type semiconductor region in the forward direction so that the area of the p-type semiconductor region is larger than the area of the n-type semiconductor region.

Further, in the photodetector and the display device according to the present embodiment, the shape of the p-type semiconductor region when viewed from the normal direction of the base substrate can be different from the shape of the n-type semiconductor region when viewed from the normal direction of the base substrate. According to this example, the area of the p-type semiconductor region can be made larger than the area of the n-type semiconductor region in a simple manner.

EMBODIMENT

Figure 1:
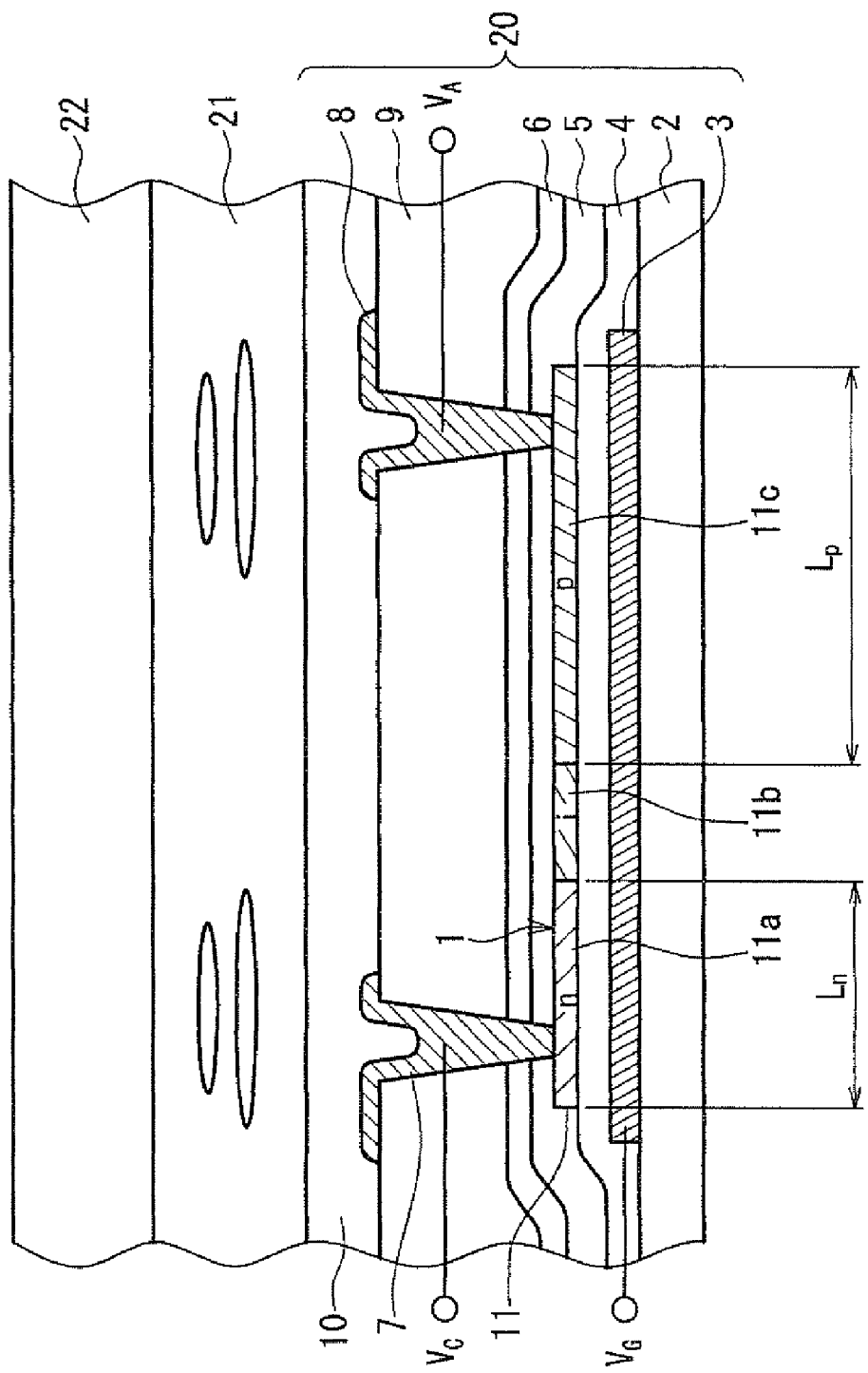
FIG. 1 is a cross-sectional view showing a schematic configuration of a photodetector according to an embodiment.
Figure 2:
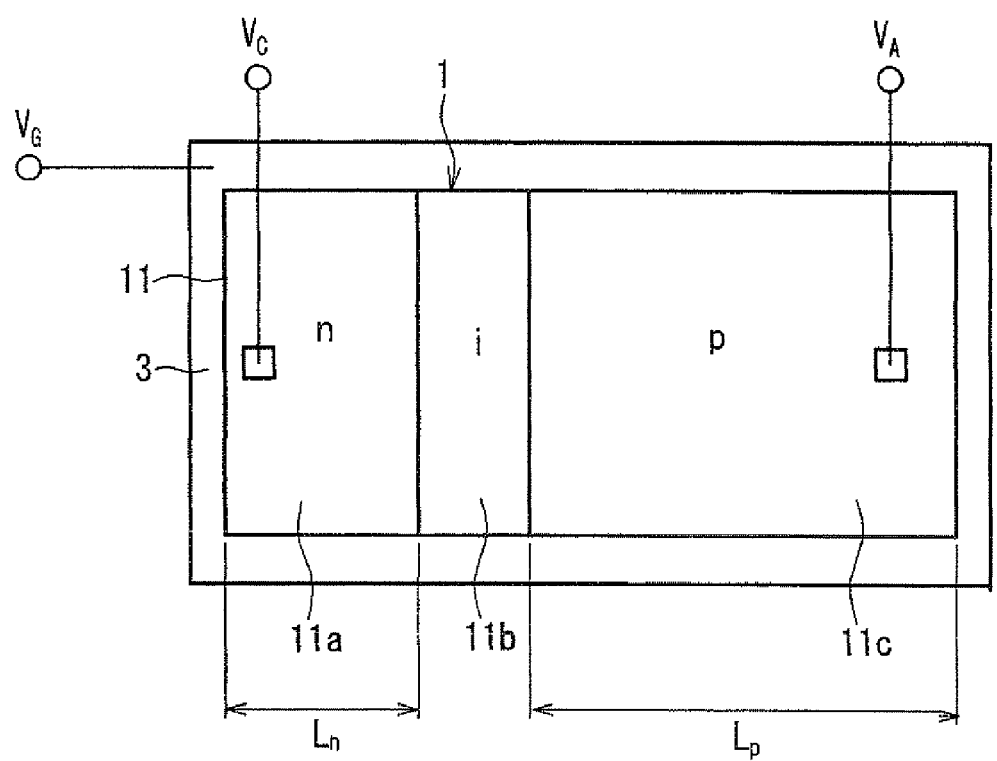
FIG. 2 is a plan view showing from above the photodetector shown in FIG. 1.
Figure 3:
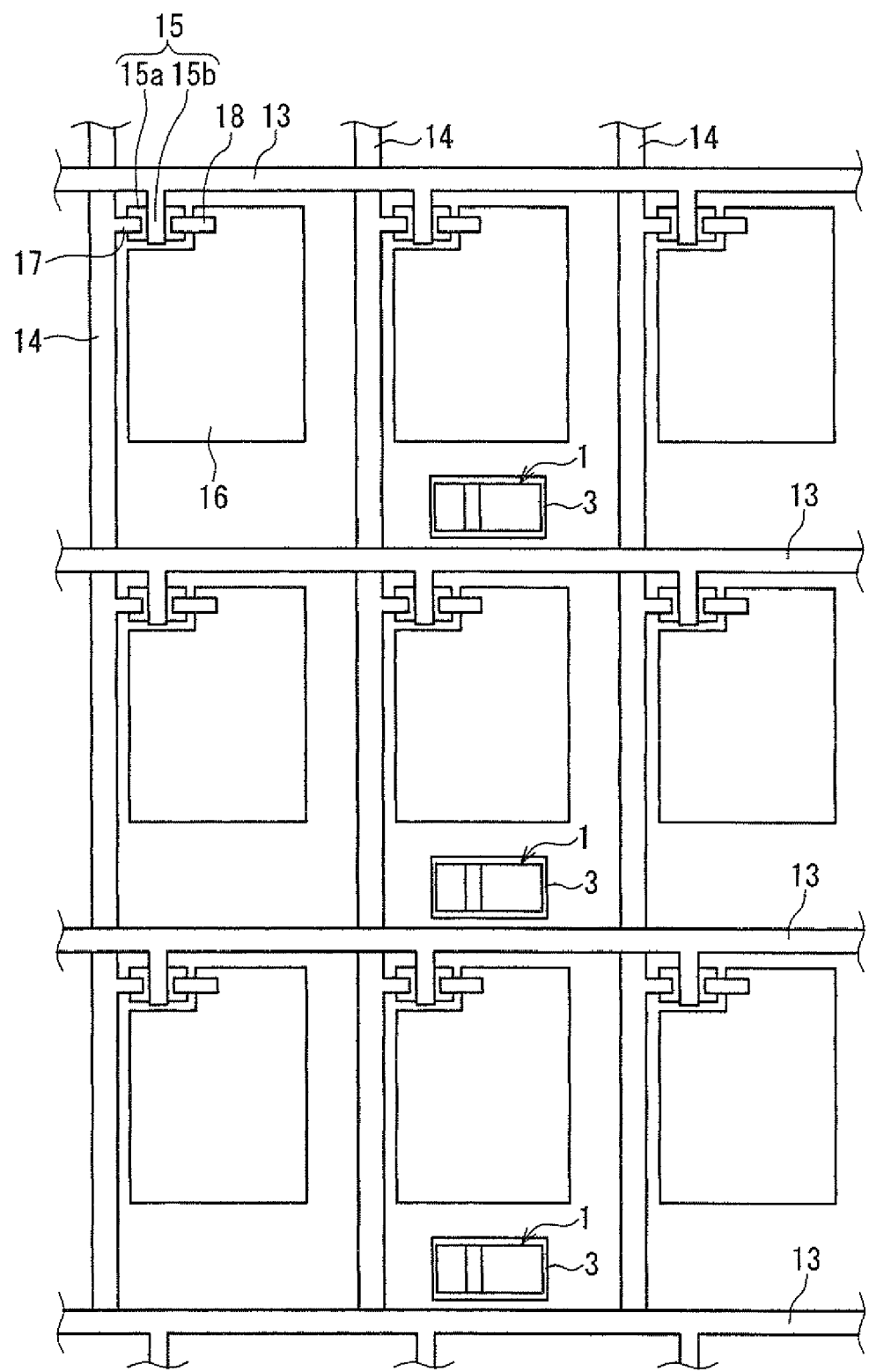
FIG. 3 is a plan view showing a schematic configuration of a part of a display device provided with the photodetector shown in FIG. 1.

Hereinafter, a photodetector and a display device according to an embodiment will be described with reference to FIGS. 1-11. First, schematic configurations of a photodetector and a display device according to the present embodiment will be described. FIG. 1 is a cross-sectional view showing a schematic configuration of a photodetector according to the embodiment of the present invention. FIG. 2 is a plan view showing from above the photodetector shown in FIG. 1. FIG. 3 is a plan view showing a schematic configuration of a part of the display device provided with the photodetector shown in FIG. 1. In FIG. 1, only the conductive and semi-conductive members for forming an active matrix substrate 20 as described below are hatched. FIGS. 2 and 3 show the main components only.

As shown in FIG. 1, a photodetector according to the present embodiment is provided to the active matrix substrate 20. The active matrix substrate 20 composes a part of the display device according to the present embodiment. The display device according to the present embodiment is a liquid crystal display device, which is formed by interposing a liquid crystal layer 21 between the active matrix substrate 20 and a filter substrate 22. In FIG. 1, the filter substrate 22 is shown only in the appearance. Though not shown, the filter substrate 22 is provided with a counter electrode and a color filter.

In the present embodiment, as shown in FIG. 3, a plurality of thin film transistors (TFTs) 15 are formed on the active matrix substrate 20. The TFTs 15 are arranged in a matrix together with transparency pixel electrodes 16 on one main surface of the base substrate 2 (see FIG. 1). The TFTs 15 function as active elements for turning on and off the pixel electrodes 16. One TFT 15 and one pixel electrode 16 compose one sub-pixel, and one pixel is composed of a set of three sub-pixels. The three sub-pixels composing one pixel are different from each other in the color of the corresponding color filters.

Furthermore, each of the TFTs 15 is provided with a silicon layer 15a on which a source region and a drain region are formed, and a gate electrode 15b. The gate electrode 15b is formed integrally with a gate wiring 13 arranged along the horizontal direction of the screen. A source electrode 17 is connected to the source region, and a drain electrode 18 is connected to the drain region. The source electrode 17 is formed integrally with a source wiring 14 arranged along the vertical direction of a screen. The drain electrode 18 is connected to the pixel electrode 16.

As shown in FIGS. 1 and 2, the photodetector includes the transparency base substrate 2, a metal layer 3 provided on a main surface of the base substrate 2, and a photodiode 1 arranged on an upper layer of the metal layer 3. In the present embodiment, the base substrate 2 composes a part of the active matrix substrate 20. The metal layer 3 is a light-shielding layer provided to prevent incidence of light from a backlight device into the photodiode 1 (hereinafter referred to as "light-shielding layer 3"). The light-shielding layer 3 is insulated electrically in the entire circumference so that it is in an electrically suspended state.

Further as shown in FIGS. 1 and 2, the photodiode 1 includes a silicon layer 11 having a semiconductor region. The silicon layer 11 is formed on an insulating layer 4 that covers the light-shielding layer 3, and insulated electrically from the light-shielding layer 3. In the present embodiment, the photodiode 1 is a PIN diode having a lateral structure. In the silicon layer 11, an n-type semiconductor region (n-layer) 11a, an intrinsic semiconductor region (i-layer) 11b and a p-type semiconductor region (p-layer) 11c are provided in this order. Among these semiconductor regions, the i-layer 11b serves as the photodetection region of the photodiode 1. The n-layer 11a, the i-layer 11b and the p-layer 11c are formed adjacent to each other in the planar direction of the silicon layer 11.

The i-layer 11b is not limited particularly as long as it is electrically neutral in comparison with the adjacent n-layer 11a and the p-layer 11c. It is preferable that the i-layer 11b is completely free of impurities and/or it is a region where the conduction electron density and the hole density are equal to each other. Alternatively however, the i-layer 11b can be an n-region where the diffusion concentration of the n-type impurity is lower than that of the n-layer 11a, or a p-region where the diffusion concentration of the p-type impurity is lower than that of the p-layer 11c.

In the present embodiment, the type of the silicon composing the silicon layer 11 is not limited particularly. However, from the viewpoint of the charge-transfer rate, the silicon layer 11 is formed preferably of a continuous grain boundary silicon or a low-temperature polysilicon. It is also preferable that the silicon layer 11 is formed by using the process for forming the TFT 15 (see FIG. 3). In the present embodiment, only the i-layer 11b is the photodetection region. Therefore, the light-shielding layer 3 is not limited particularly as long as it shields light from the i-layer 11b of the silicon layer 11.

Figure 12:
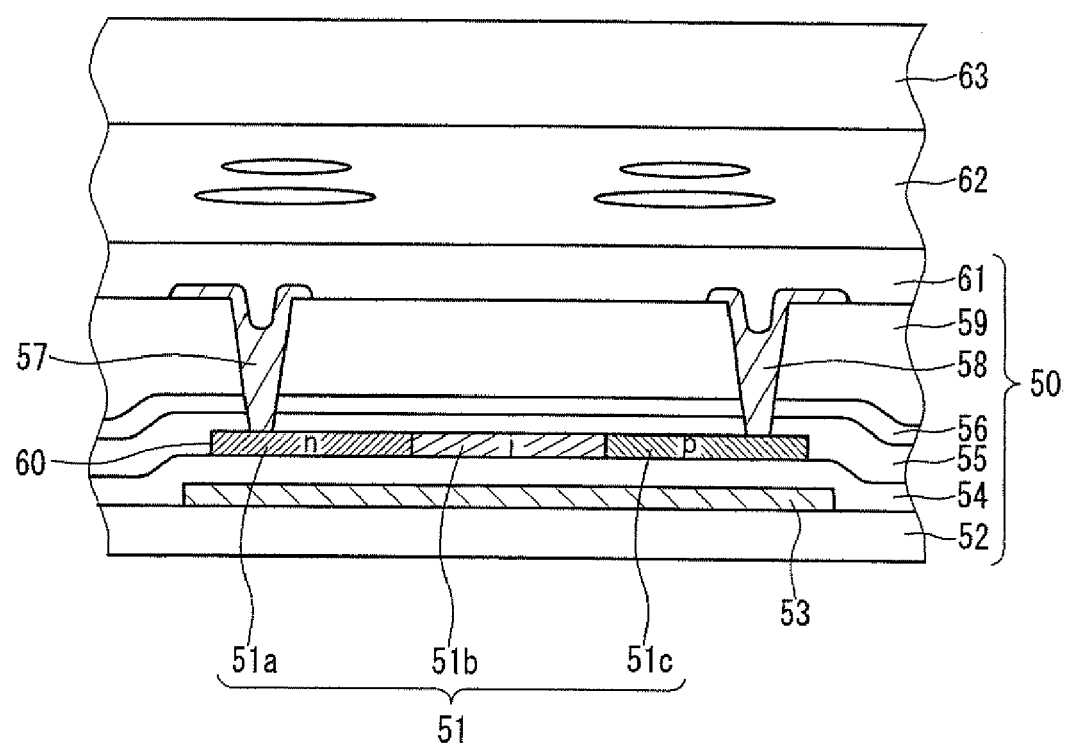
FIG. 12 is a cross-sectional view showing a configuration of a conventional liquid crystal display panel provided with a photodiode.

Accordingly, the photodiode 1 of the present embodiment includes the silicon layer 11 in which the n-layer 11a, the layer 11b and the p-layer 11c are formed similarly to the photodiode 51 (prior art) as shown in FIG. 12 related to the Technical Field.

However, unlike the prior art, the p-layer 11c of in the present embodiment is formed to have an area larger than the area of the n-layer 11a for the purpose of stabilizing the output characteristics of the photodiode. In the present embodiment, the length $L_p$ of the p-layer 11c in the forward direction is set greater than the length $L_n$ of the n-layer 11a, thereby setting the area of the p-layer 11c larger than the area of the n-layer 11a.

Specifically, the length $L_p$ of the p-layer 11c in the forward direction and the length $L_n$ of the n-layer 11a are set so that the difference between the lengths will not be smaller than a process error (3 μm for instance). As a result, as described below, an electric potential $V_G$ of the light-shielding layer 3 approaches an electric potential. $V_A$ of the p-layer 11c. And thus, as shown in FIG. 3 for instance, in a case where a plurality of photodiodes 1 of the same specification are formed on one active matrix substrate 20, occurrence of variations in the output characteristics among the photodiodes 1 can be suppressed. This will be described later in detail.

Here, the silicon layer 11 is covered with an interlayer insulating layer 5 and an interlayer insulating layer 6. The light-shielding layer 3 is formed so that it is overlapped with the entire silicon layer 11 in the thickness direction of the base substrate 2 (see FIG. 2). In FIG. 1, numeral 9 denotes a flattening layer, 10 denotes a protective layer. Numeral 7 denotes a wiring connected to the n-layer 11a, and 8 denotes a wiring connected to the p-layer 11c. The wirings 7 and 8 are formed to penetrate the interlayer insulating layers 5, 6 and the flattening layer 9. In FIG. 3, the wirings 7 and 8 are not shown.

The following explanation with reference to FIGS. 4-11 relates to stabilization of the output characteristics of the photodiode 1 in a case where the area (length $L_p$) of the p-layer 11c is larger than the area (length $L_n$) of the n-layer. First, an influence imposed on the photodiode by the electric potential $V_G$ of the light-shielding layer in a case where the area of the p-layer is equal to the area of the n-layer ($L_p=L_n$) will be explained with reference to FIGS. 4-6.

Figure 4A:
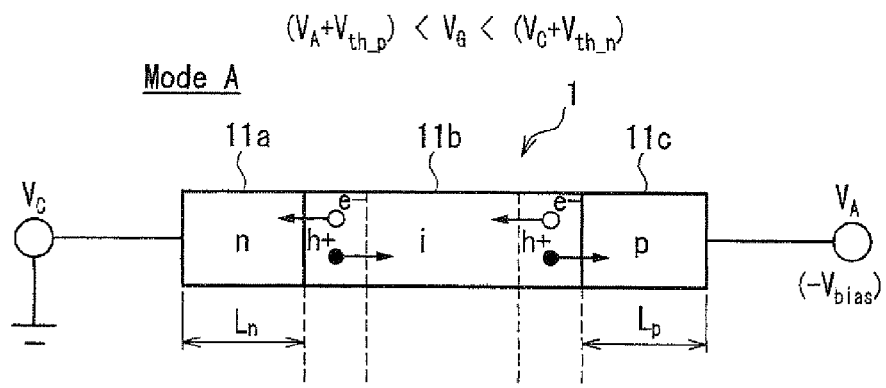
FIG. 4A shows flows of free electrons and positive holes.
Figure 4B:
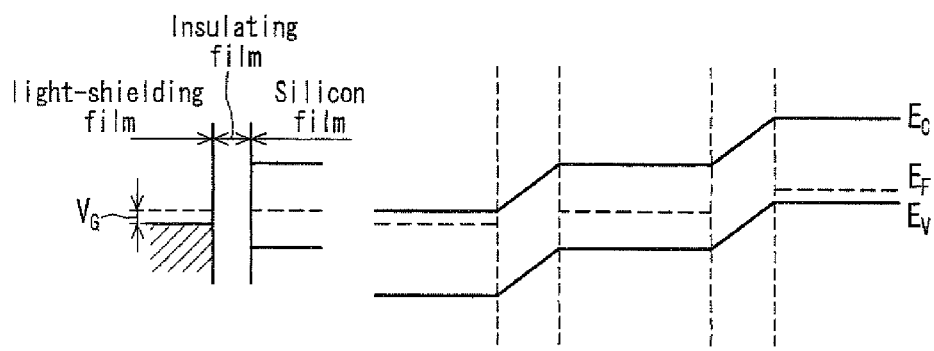
FIG. 4B shows an energy band in the photodiode.
Figure 4C:
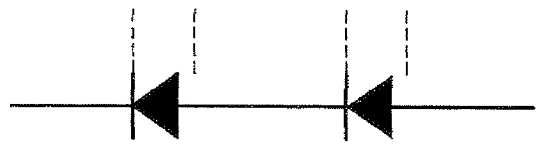
FIG. 4C shows an equivalent circuit.
Figure 5A:
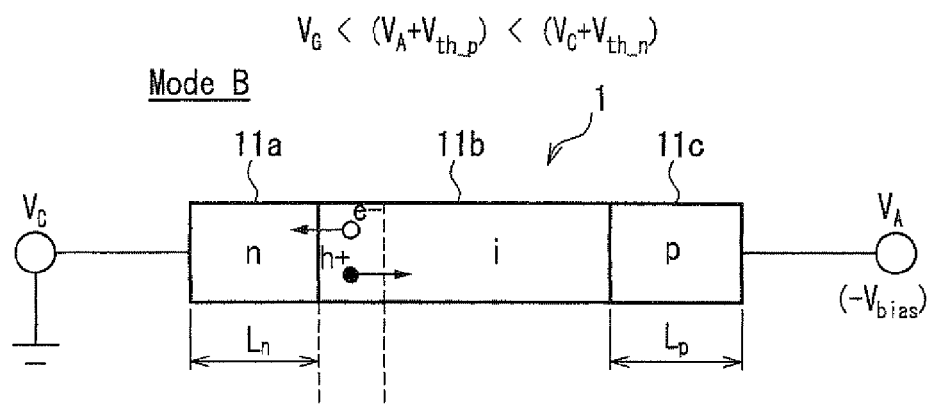
FIG. 5A shows flows of free electrons and positive holes.
Figure 5B:
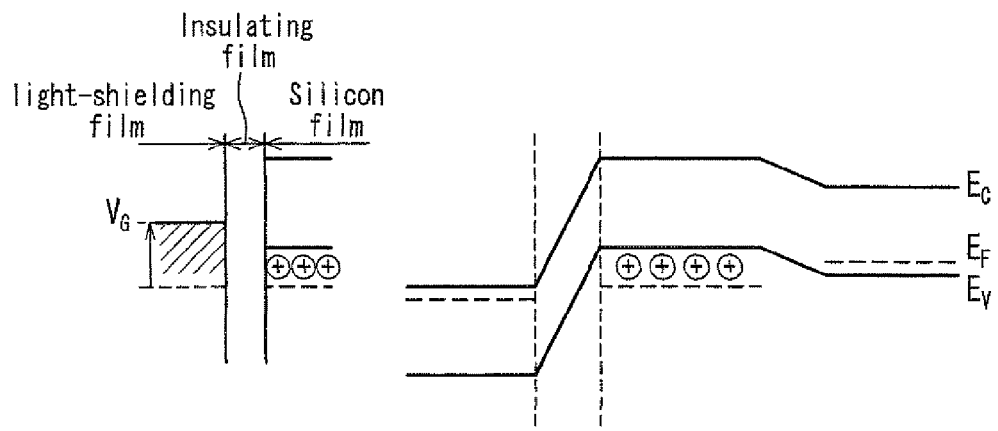
FIG. 5B shows an energy band in the photodiode.
Figure 5C:
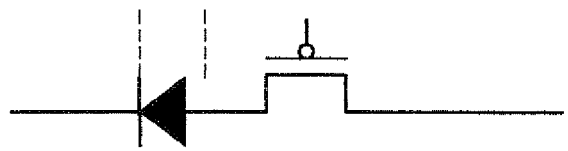
FIG. 5C shows an equivalent circuit.
Figure 6A:
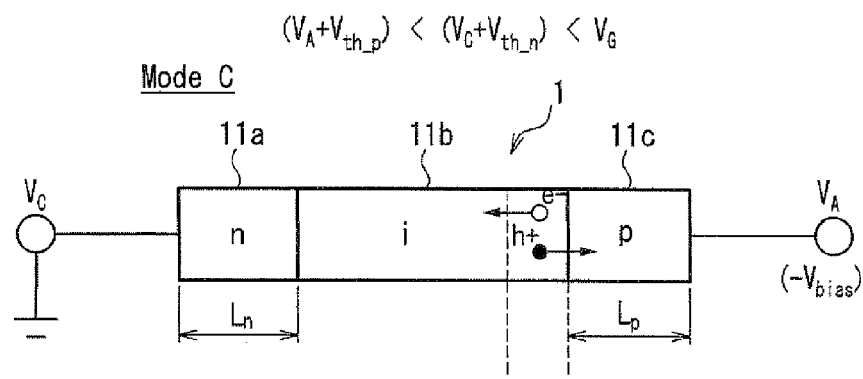
FIG. 6A shows flows of free electrons and positive holes.
Figure 6B:
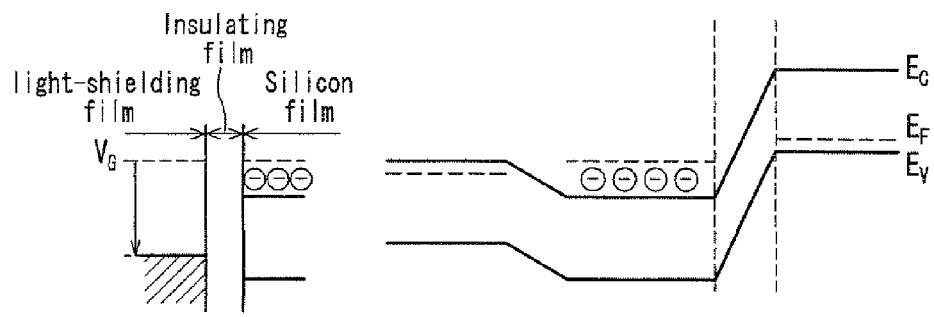
FIG. 6B shows an energy band in the photodiode.
Figure 6C:
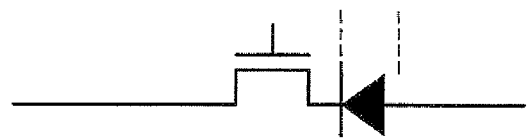
FIG. 6C shows an equivalent circuit.

FIGS. 4-6 are diagrams respectively showing the electric potentials of the light-shielding layers and the states of the photodiodes. FIGS. 4A, 5A and 6A show the flows of free electrons and positive holes, FIGS. 4B, 5B and 6B show energy bands in the photodiodes, and FIGS. 4C, 5C and 6C show equivalent circuits.

The electric potential $V_G$ of the light-shielding layer 3 in FIG. 4 satisfies the formula (1) below, the same electric potential in FIG. 5 satisfies the formula (2) below, and the same electric potential in FIG. 6 satisfies the formula (3) below. In the examples as shown in FIGS. 4-6, the length $L_p$ of the p-layer 11c in the forward direction is equal to the length $L_n$ of the n-layer 11a in the forward direction.

In FIGS. 4-6, $V_C$ denotes an electric potential in the n-layer 11a of the photodiode 1, and $V_A$ denotes an electric potential in the p-layer 11c of the photodiode 1. $V_{th\_n}$ denotes a threshold voltage for a case of a n-channel MOS transistor having the n-layer 11a as a source-drain region, the light-shielding layer 3 as a gate electrode, and the insulating layer 4 as a gate insulating layer. Similarly, $V_{th\_p}$ denotes a threshold voltage for a case of a p-channel MOS transistor having the p-layer 11c as a source-drain region, the light-shielding layer 3 as a gate electrode, and the insulating layer 4 as a gate insulating layer. $E_C$ denotes an energy level in a conduction band, $E_F$ denotes an energy level in a forbidden band, and $E_V$ denotes an energy level in a valence band.

[Formula 1]

$$(V_A + V_{th\_p}) < V_G < (V_C + V_{th\_n}) \quad (1)$$

[Formula 2]

$$V_G < (V_A + V_{th\_p}) < (V_C + V_{th\_n}) \quad (2)$$

[Formula 3]

$$(V_A + V_{th\_p}) < (V_C + V_{th\_n}) < V_G \quad (3)$$

As shown in FIGS. 4A and 4B, in a case where the electric potential $V_G$ of the light-shielding layer 3 satisfies the above formula (1) (hereinafter, this case is referred to as "mode A"), transfer of the free electrons and the positive holes will occur easily in the vicinity of both the interfaces of the i-layer 11b. As shown in FIG. 4C, in the mode A, a current can flow smoothly within the photodiode 1.

As shown in FIGS. 5A and 5B, in a case where the electric potential $V_G$ of the light-shielding layer 3 satisfies the above formula (2) (hereinafter, this case is referred to as "mode B"), transfer of the free electrons and the positive holes will occur easily only in the vicinity of the interface of the i-layer 11b at the n-layer 11a side. As shown in FIG. 5C, in the mode B, the current flow is hindered by the i-layer 11b.

As shown in FIGS. 6A and 6B, in a case where the electric potential $V_G$ of the light-shielding layer 3 satisfies the above formula (3) (hereinafter, this case is referred to as "mode C"), transfer of the free electrons and the positive holes will occur easily only in the vicinity of the interface of the i-layer 11b at the p-layer 11c side. As shown in FIG. 6C, in the mode C, the current flow is hindered by the i-layer 11b similarly to the case of the mode B.

Figure 7:
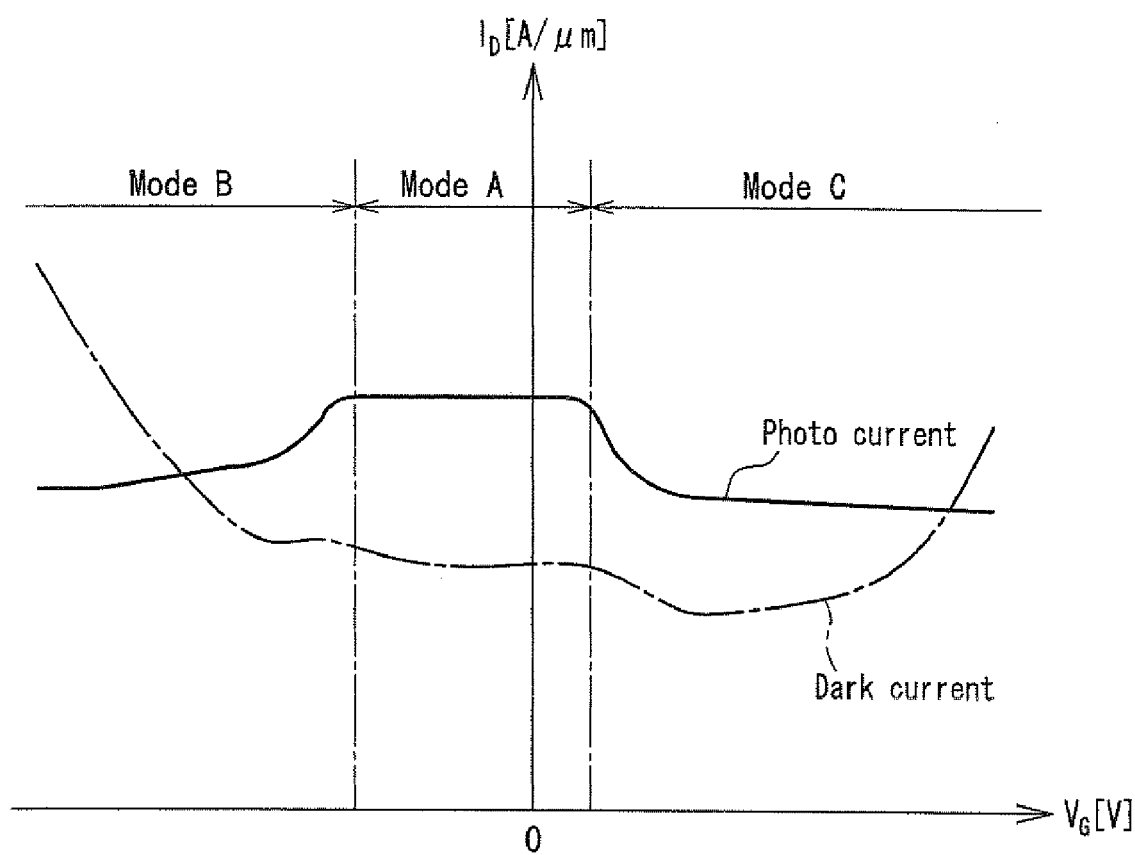
FIG. 7 is a diagram showing a relationship between a photocurrent in the photodiode and an electric potential of the light-shielding layer.

Here, the relationship between the respective modes and a photocurrent will be explained with reference to FIG. 7. FIG. 7 is a diagram showing the relationship between a photocurrent in the photodiode and the electric potential of the light-shielding layer. In FIG. 7, the y-axis indicates a current value [A/μm] of a current outputted from the photodiode 1, and the x-axis indicates the electric potential $V_G$[V] of the light-shielding layer 3. Similarly, the example shown in FIG. 7 refers to a case where the length $L_p$ of the p-layer 11c in the forward direction is equal to the length $L_n$ of the n-layer 11a in the forward direction.

As shown in FIG. 7, the photocurrent and the dark current of the photodiode 1 fluctuate depending on the electric potential $V_G$ of the light-shielding layer 3. The photocurrent and the dark current fluctuate particularly at the time of a switchover between the modes. In light of this, it is preferable that the electric potential $V_G$ of the light-shielding layer 3 is set to avoid the switchover of the modes in the photodiode 1.

And there is a tendency that the photocurrent increases the most and the dark current becomes the lowest at the time of the mode A as shown in FIG. 4. Namely, when the photodiode 1 is in the mode A, the ratio of the photocurrent to the dark current (S/N ratio) is raised, and the output characteristics of the photodiode 1 turn to be a preferable state. In light of this, it is preferable that the electric potential $V_G$ of the light-shielding layer 3 is set so that the photodiode 1 is in the mode A constantly.

It should be noted that FIG. 7 shows only one example, and substantially the respective ranges of the modes A to the mode C vary among the photodiodes 1. Namely, the relationship between the electric potential $V_G$ of the light-shielding layer 3 and the output characteristics of the photodiode 1 varies among the photodiodes 1. This is because that the diffusion concentrations of the n-layer 11a and the p-layer 11c vary even among the photodiodes of the same specification, and thus, variations exist in the threshold voltages $V_{th\_n}$ and $V_{th\_p}$. Another reason is that the electric charge amount of the fixed charge contained in the photodiode 1, the light-shielding layer 3 and the like varies among the photodiodes. Hereinafter, the fluctuation in the range of the mode A depending on the threshold voltages $V_{th\_n}$ and $V_{th\_p}$ will be described with reference to FIGS. 8-10.

Figure 8:
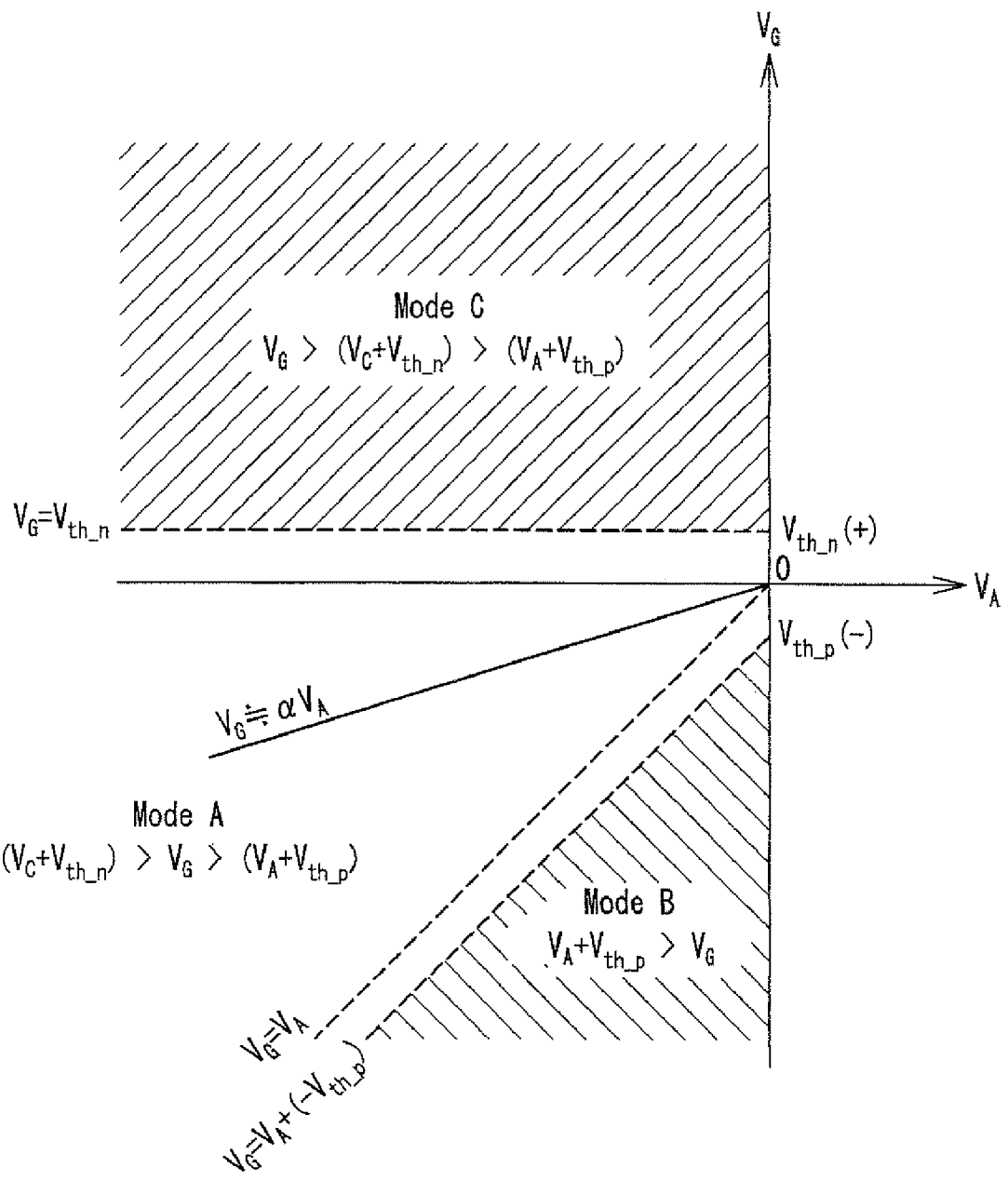
FIG. 8 is a diagram showing the respective ranges of a mode A to a mode C.
Figure 9:
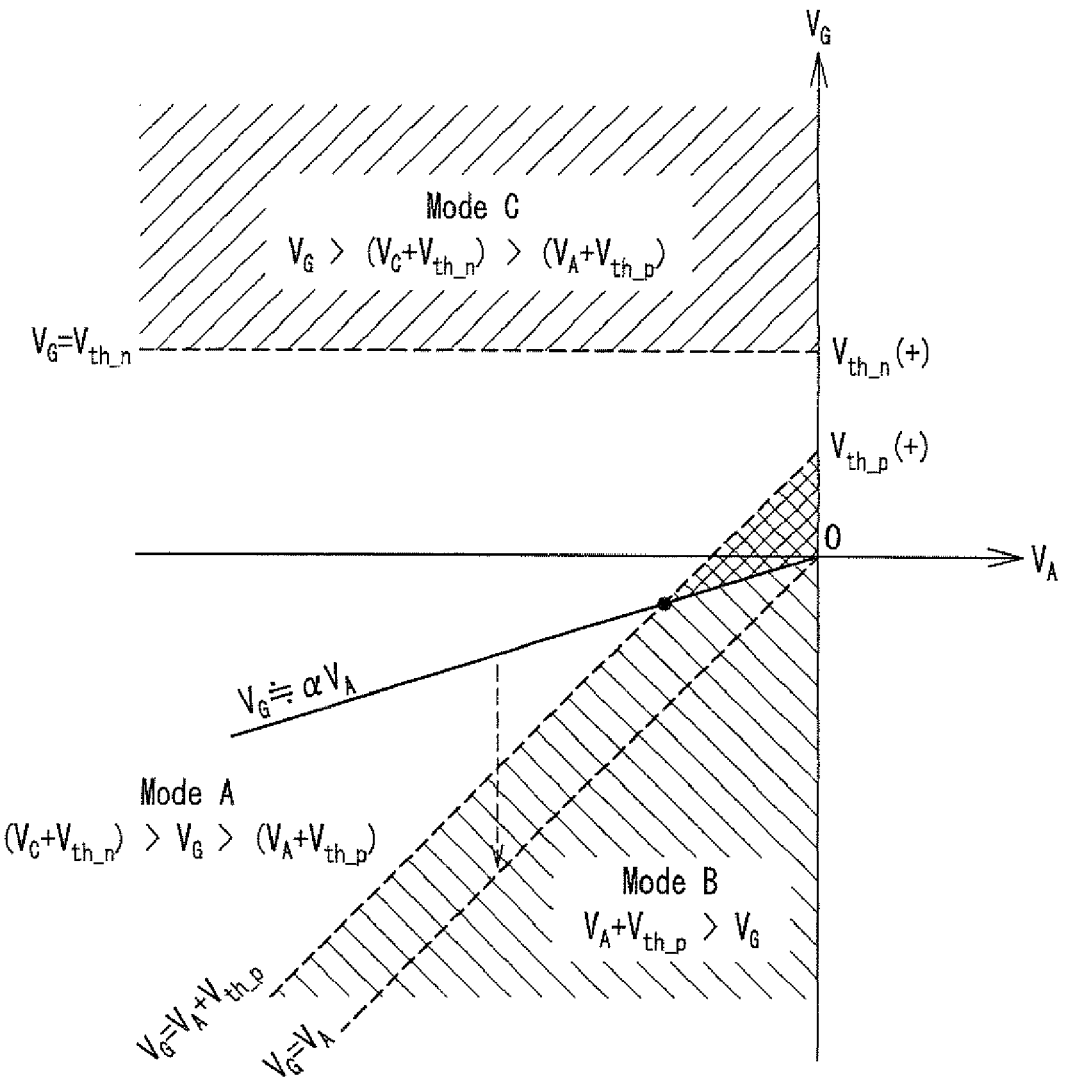
FIG. 9 is a diagram showing the respective ranges of a mode A to a mode C.
Figure 10:
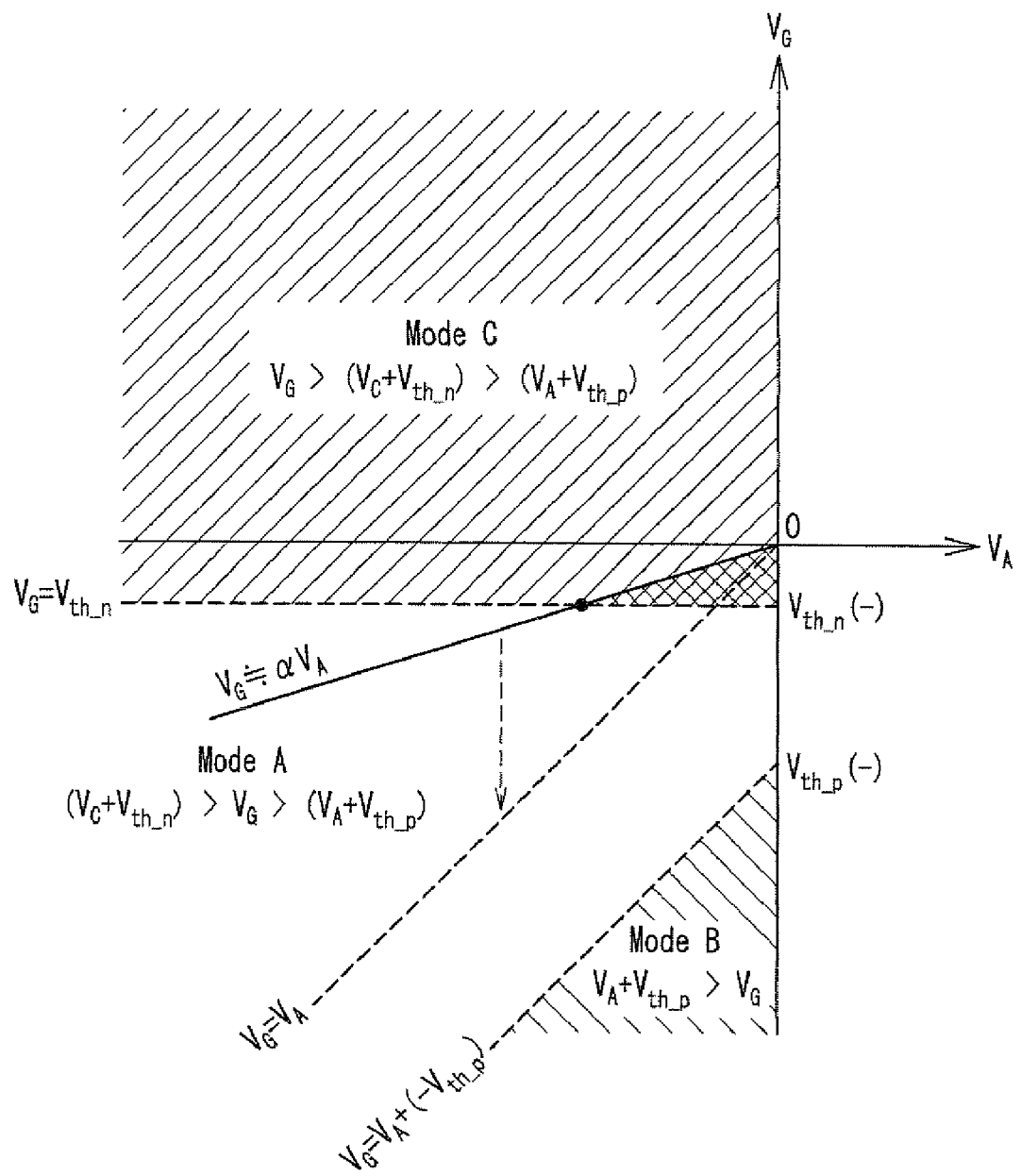
FIG. 10 is a diagram showing the respective ranges of a mode A to a mode C.

FIGS. 8-10 are diagrams showing the respective ranges of the mode A to the mode C, which are different from each other in the relationship between the electric potentials of the light-shielding layers and the output characteristics of the photodiodes. In each of the drawings, the y-axis indicates the electric potential $V_G$ of the light-shielding layer, and the x-axis indicates the electric potential $V_A$ of the p-layer 11c.

Between the light-shielding layer 3 and the photodiode 1, capacitances are formed by the insulating layer 4. When the capacitance between the n-layer 11a and the light-shielding layer 3 is expressed as $C_{gc}$ and the capacitance between the p-layer 11c and the light-shielding layer 3 is expressed as $C_{ga}$ (see FIG. 11), the electric potential $V_G$ of the light-shielding layer 3 can be approximated as shown in the formula (4) below by using the electric potential $V_A$ of the p-layer 11c.

[Formula 4]

$$V_G \approx V_A \left( \frac{C_{ga}}{C_{gc} + C_{ga}} \right) \quad (4)$$

In the above formula (4), when $(C_{ga}/C_{gc}+C_{ga})=\alpha$, the electric potential $V_G$ of the light-shielding layer 3 can be approximated further by using the formula (5) below. In FIGS. 8-10, the electric potential $V_G$ of the light-shielding layer 3 is expressed by the formula (5) below.

[Formula 5]

$$V_G \approx \alpha V_F \quad (5)$$

For instance, when the length $L_p$ of the p-layer 11c in the forward direction and the length $L_n$ of the n-layer 11a in the forward direction are equal to each other, the α value becomes (½). In fact however, in the above formula (5), the α value is not constant but it varies among the modes. Therefore in the example as shown in FIGS. 9 and 10, the gradient of the straight line indicating the above formula (5) will vary among the modes.

For example, in the mode B, the region of the p-layer 11c is increased substantially as shown in FIG. 5, and the $C_{ga}$ value becomes greater in comparison with the case of the mode A.

Therefore in the mode B, the α value become greater and the gradient of the straight line indicating the above formula (5) becomes larger. On the other hand, in the mode C, the region of the n-layer 11a is increased substantially as shown in FIG. 6, and the $C_{gc}$ value becomes greater in comparison with the case of the mode A. Therefore in the mode C, the α value become smaller and the gradient of the straight line indicating the above formula (5) becomes smaller. However, since the fluctuation width of the actual α value is trivial, it is not shown in FIGS. 8-10.

Hereinafter, FIGS. 8-10 will be discussed. In an example as shown in FIG. 8 where the threshold voltage $V_{th\_n}$ is positive and the threshold voltage $V_{th\_p}$ is negative, a straight line indicating the above formula (5) exists constantly within the range of the mode A irrespective of the electric potential $V_A$ of the p-layer 11c. Therefore in this case, the photodiode 1 is in the state of mode A constantly.

In contrast, in an example as shown in FIG. 9 where both the threshold voltages $V_{th\_n}$ and $V_{th\_p}$ are positive, the straight line indicating the above formula (5) crosses the boundary line between the mode A and the mode B when the electric potential $V_A$ of the p-layer 11c approaches zero. At this time, the mode of the photodiode 1 is changed from the mode A to the mode B, and the output characteristics fluctuate considerably.

Further in an example as shown in FIG. 10 where both the threshold voltages $V_{th\_n}$ and $V_{th\_p}$ are negative, the straight line indicating the above formula (5) crosses the boundary line between the mode A and the mode C when the electric potential $V_A$ of the p-layer 11c approaches zero. At this time, the mode of the photodiode 1 is changed from the mode A to the mode C, and the output characteristics fluctuate considerably.

In view of the results as shown in FIGS. 8-10, it is preferable that the straight line indicating the electric potential $V_G$ of the light-shielding layer 3 does not cross the boundary between the modes, in order to stabilize the output characteristics of the photodiodes 1 and to suppress occurrence of variations. Even for a case where the lines cross each other, when the $V_A$ is set within a range approximate to zero, changing of the mode can be prevented by making these lines cross each other when the $V_A$ is a large negative value. In a case where the $V_A$ is set to a large negative value, the mode change can be prevented by causing the crossing when the $V_A$ is close to zero.

Figure 11:
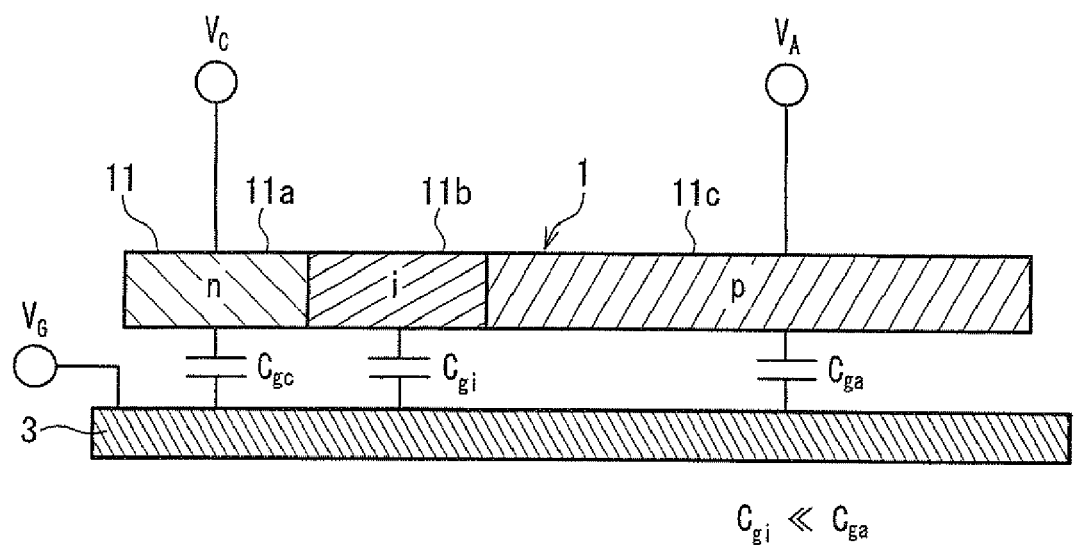
FIG. 11 is an explanatory view showing a relationship between the light-shielding layer, the photodiode and the electrode.

Next, the electric potential $V_G$ of the light-shielding layer 3 in the present embodiment will be explained with reference to FIG. 11. FIG. 11 is an explanatory view showing the relationship between the light-shielding layer, the photodiode, and the electrode. In the present embodiment, the area of the p-layer 11c is larger than the area of the n-layer 11a. Specifically, the length $L_p$ of the p-layer 11c in the forward direction is greater than the length $L_n$ of the n-layer 11a in the forward direction ($L_p > L_n$). Therefore, the capacitance $C_{ga}$ between the p-layer 11c and the light-shielding layer 3 becomes greater than the capacitance $C_{gc}$ between the n-layer 11a and the light-shielding layer 3 ($C_{ga} > C_{gc}$).

At this time, as shown in FIG. 11, if the length $L_p$ of the p-layer 11c in the forward direction becomes considerably greater than the length $L_n$ of the n-layer 11a in the forward direction ($L_p \gg L_n$), the capacitance $C_{ga}$ also become greater considerably than the capacitance $C_{gc}$ ($C_{ga} \gg C_{gc}$). In this case, the α in the above formula (5) approaches 1, and the following formula (6) is established. The following formula (6) will be established for any photodiodes of the same specification.

[Formula 6]

$$V_G \approx V_A \qquad (6)$$

In a case where the above formula (6) is established, namely, the electric potential $V_G$ of the light-shielding layer 3 becomes equal to the electric potential $V_A$ of the p-layer 11c, the straight line indicating the electric potential $V_G$ of the light-shielding layer 3 will not cross the boundary between the modes in FIG. 9. In FIG. 10, the intersection between the straight line indicating the electric potential $V_G$ of the light-shielding layer 3 and the boundary between the modes approaches to zero, and thus it is effective for a case where the $V_A$ is set to a negative large value.

Even for a case where the above formula (6) is not established, the $V_G$ will approach the $V_A$ when the area of the p-layer 11c becomes larger than the area of the n-layer 11a. In this case, in FIG. 9, the intersection of the straight line indicating the electric potential $V_G$ of the light-shielding layer 3 and the boundary between the modes transfers in the negative direction, and thus it is effective for a case where the $V_A$ is set within a range approximate to zero. In FIG. 10, similarly to a case where the above formula (6) is established, it is effective for a case where the $V_A$ is set to a negative large value.

In this manner, according to the present embodiment, the $V_A$ range can be adjusted not to cause changes in the output characteristics. Therefore, in a case where an equivalent voltage ($V_A$) is applied to photodiodes 1 of the same specification, it is possible to control to equalize the respective output characteristics. In addition to that, it is also possible to suppress a fluctuation in the output characteristics of the photodiodes 1. Thus, it is possible to suppress variations in the output characteristics among the respective photodiodes 1 for instance, in a case where a plurality of photodiodes 1 are provided as shown in FIG. 3.

As described above, in the present embodiment, the area of the p-layer 11c is set larger than the area of the n-layer 11a by setting the length $L_p$ of the p-layer 11c in the forward direction greater than the length $L_n$ of the n-layer 11a in the forward direction, but the present embodiment is not limited to this example. In an alternative embodiment, the area of the p-layer 11c can be set larger than the area of the n-layer 11a by differentiating the shape of the p-layer 11c viewed from the normal direction (from above) of the base substrate 2, from the shape of the n-layer 11a viewed from the same direction.

It is also possible for instance that the length $L_p$ of the p-layer 11c in the forward direction is equal to the length $L_n$ of the n-layer 11a in the forward direction but the n-layer 11a viewed from the normal direction (from above) of the base substrate 2 is shaped obtuse (hexagon). Alternatively, the lengths of the p-layer and the n-layer are differentiated from each other not in the forward direction but the direction perpendicular to the forward direction, thereby increasing the area of the p-layer more than the area of the n-layer. According to a further alternative embodiment, both the lengths and the shapes of the layers are differentiated from each other so as to increase the area of the p-layer more than the area of the n-layer.

In the present specification, "the electric potential $V_G$ of light-shielding layer becomes equal to the electric potential $V_A$ of p-layer" refers to not only the case where the two electric potentials coincides perfectly with each other but a case where the electric potentials can be regarded as substantially equal.

Although the present embodiment refers to a case where the display device is the liquid crystal display device, the display device according to the present embodiment will not be limited to the example. The display device can be an organic EL display device or an inorganic EL display device for instance other than the liquid crystal display device.

As mentioned above, the photodetector of the present embodiment can be incorporated in a display device such as a liquid crystal display device or an EL display device. A display device of the present embodiment further can be used as a liquid crystal display device, an EL display device or the like. The photodetector and the display device of the present embodiment have industrial availability.

The invention claimed is:

1. A photodetector comprising: a transparency base substrate, a metal layer provided on one main surface of the base substrate, and a photodiode arranged on an upper layer of the metal layer, wherein
    the metal layer is formed to be overlapped with the entire photodiode in the thickness direction of the base substrate,
    the photodiode comprises a silicon layer insulated electrically from the metal layer,
    the silicon layer has a p-type semiconductor region, an intrinsic semiconductor region and an n-type semiconductor region that are formed adjacent to each other in the planar direction of the silicon layer, and
    the p-type semiconductor region is formed to have an area larger than the area of the n-type semiconductor region.

2. The photodetector according to claim 1, wherein the length of the p-type semiconductor region in the forward direction is set to be greater than the length of the n-type semiconductor region in the forward direction so that the area of the p-type semiconductor region is larger than the area of the n-type semiconductor region.

3. The photodetector according to claim 1, wherein the shape of the p-type semiconductor region when viewed from the normal direction of the base substrate is different from the shape of the n-type semiconductor region when viewed from the normal direction of the base substrate.

4. A display device having an active matrix substrate, wherein
    the active matrix substrate comprises a transparency base substrate, a plurality of active elements formed on one main surface of the base substrate, and a photodetector,
    the photodetector comprises a metal layer provided on one main surface of the base substrate, and a photodiode arranged on an upper layer of the metal layer,
    the metal layer is formed to be overlapped with the entire photodiode in the thickness direction of the base substrate,
    the photodiode comprises a silicon layer insulated electrically from the metal layer,
    the silicon layer has a p-type semiconductor region, an intrinsic semiconductor region and an n-type semiconductor region that are formed adjacent to each other in the planar direction of the silicon layer, and
    the p-type semiconductor region is formed to have an area larger than the area of the n-type semiconductor region.

5. The display device according to claim 4, wherein the shape of the p-type semiconductor region when viewed from the normal direction of the base substrate is different from the shape of the n-type semiconductor region when viewed from the normal direction of the base substrate.

6. The display device according to claim 4, wherein the length of the p-type semiconductor region in the forward direction is set to be greater than the length of the n-type semiconductor region in the forward direction so that the area of the p-type semiconductor region is larger than the area of the n-type semiconductor region.

* * * * *